United States Patent
Tsai et al.

(10) Patent No.: US 7,177,620 B1
(45) Date of Patent: Feb. 13, 2007

(54) MIXER CONSTANT LINEAR RANGE BIASING APPARATUS AND METHOD

(75) Inventors: King Chun Tsai, San Jose, CA (US); Lawrence Tse, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 562 days.

(21) Appl. No.: 10/388,920

(22) Filed: Mar. 14, 2003

Related U.S. Application Data (60) Provisional application No. 60/443,395, filed on Jan. 29, 2003.

(51) Int. Cl.
*H04B 1/28* (2006.01)
*H04B 1/26* (2006.01)

(52) U.S. Cl. .................. 455/333; 455/323; 455/332; 455/330; 455/326; 455/293

(58) Field of Classification Search ............... 455/333, 455/323, 332, 330, 326, 293
See application file for complete search history.

(56) References Cited

U.S. PATENT DOCUMENTS

| | | | | |
|---|---|---|---|---|
| 5,523,717 | A * | 6/1996 | Kimura | .................. 330/252 |
| 5,589,791 | A * | 12/1996 | Gilbert | .................. 327/359 |
| 6,018,270 | A | 1/2000 | Stuebing et al. | |
| 6,028,478 | A | 2/2000 | Seremeta et al. | |
| 6,054,889 | A | 4/2000 | Kobayashi | |
| 6,138,000 | A | 10/2000 | Navid et al. | |
| 6,345,178 | B1 | 2/2002 | Haapala | |
| 6,542,019 | B1 * | 4/2003 | Lim et al. | .................. 327/65 |
| 2001/0041548 | A1 | 11/2001 | Bult et al. | |

FOREIGN PATENT DOCUMENTS

| | | |
|---|---|---|
| EP | 1176713 A1 | 1/2002 |
| EP | 1187310 A2 | 3/2002 |

OTHER PUBLICATIONS

G. Giustolisi; G. Palmisano and S. Pennisi, (High-Linear Class AB Transconductor for High Frequency Applications, ISCAS 2000—IEEE International Symposium on Circuits and Systems, May 28-31, 2000, Geneva, Switzerland, pp. V169-V172).*
U.S. Appl. No. 10/292,087, filed Nov. 11, 2002, Tsai.
U.S. Appl. No. 10/292,087, filed Nov. 11, 2002, Tsai et al.
Tanaka, S. et al. "A Linearization Technique for CMOS RF Power Amplifiers," *1997 Symposium on VLSI Circuits Digest of Technical Papers*, pp. 93-94.

* cited by examiner

*Primary Examiner*—Quochien B. Voung
*Assistant Examiner*—Wen Huang

(57) ABSTRACT

A Gilbert cell mixer for a wireless transceiver includes a first stage that performs voltage to current conversions and that includes first and second transistors that are operated in a saturation region and third and fourth transistors that are operated in a triode region. A second stage communicates with the first stage and that performs frequency conversion. A biasing circuit communicates with the first stage to maintain a substantially constant input linear range over temperature and process variations.

34 Claims, 7 Drawing Sheets

MIXER CONSTANT LINEAR RANGE BIASING APPARATUS AND METHOD

CROSS-REFERENCE TO RELATED APPLICATIONS

This application claims the benefit of U.S. Provisional Application No. 60/443,395, filed on Jan. 29, 2003. The disclosure of the above application is incorporated herein by reference.

FIELD OF THE INVENTION

The present invention relates to mixers, and more particularly to a biasing circuit for Gilbert cell mixers in wireless transceivers.

BACKGROUND OF THE INVENTION

Figure 1:
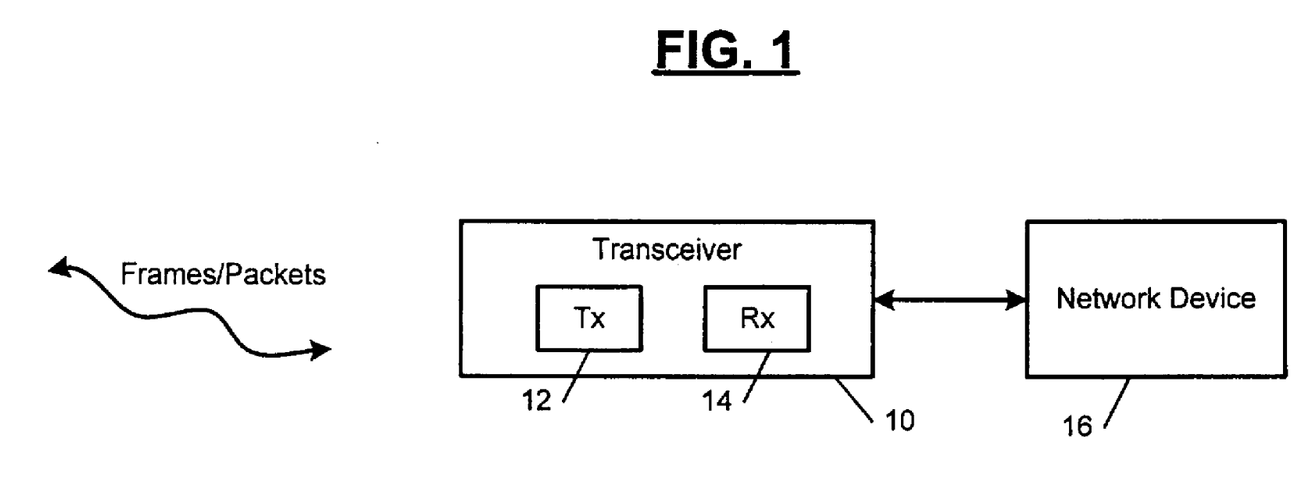
FIG. 1 is a functional block diagram of an exemplary wireless transceiver according to the prior art.

Referring now to FIG. 1, a wireless transceiver 10 is shown and includes a transmitter 12 and a receiver 14. The wireless transceiver 10 may be used in a local area network (LAN) and may be attached to a Baseband Processor (BBP) and a Media Access Controller (MAC) in either a station or an Access Point (AP) configuration. A network interface card (NIC) is one of the various "STATION" configurations. The NIC can be connected to a networked device 16 such as a laptop computer, a personal digital assistant (PDA) or any other networked device. When the transceiver 10 is attached to an access point (AP) MAC, an AP is created. The AP provides network access for wireless local area network (WLAN) stations that are associated with the transceiver 10.

The wireless transceiver 10 transmits and receives frames/packets and provides communication between two networked devices. In AdHoc mode, the two devices can be two laptop/personal computers. In infrastructure mode, the two devices can be a laptop/personal computer and an AP.

Figure 2A:
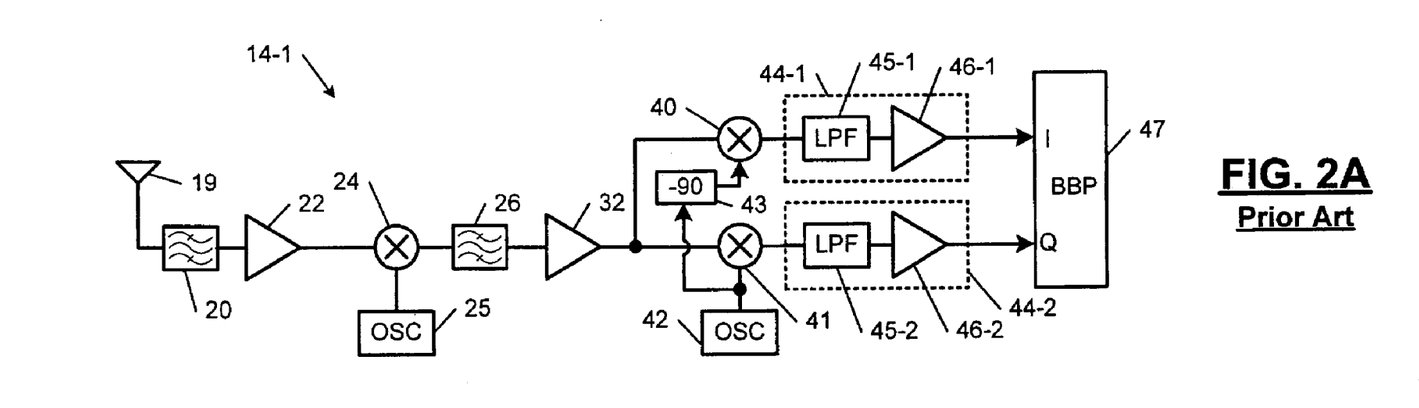
FIG. 2A is a functional block diagram of an exemplary super-heterodyne receiver architecture according to the prior art.

There are multiple different ways of implementing the transmitter 12 and the receiver 14. For purposes of illustration, simplified block diagrams of super-heterodyne and direct conversion transmitter and receiver architectures will be discussed, although other architectures may be used. Referring now to FIG. 2A, an exemplary super-heterodyne receiver 14-1 is shown. The receiver 14-1 includes an antenna 19 that is coupled to an optional RF filter 20 and a low noise amplifier 22. An output of the amplifier 22 is coupled to a first input of a mixer 24. A second input of the mixer 24 is connected to an oscillator 25, which provides a reference frequency. The mixer 24 converts radio frequency (RF) signals to intermediate frequency (IF) signals.

An output of the mixer 24 is connected to an optional IF filter 26, which has an output that is coupled to an automatic gain control amplifier (AGCA) 32. An output of the AGCA 32 is coupled to first inputs of mixers 40 and 41. A second input of the mixer 41 is coupled to an oscillator 42, which provides a reference frequency. A second input of the mixer 40 is connected to the oscillator 42 through a −90° phase shifter 43. The mixers 40 and 41 convert the IF signals to baseband (BB) signals. Outputs of the mixers 40 and 41 are coupled to BB circuits 44-1 and 44-2, respectively. The BB circuits 44-1 and 44-2 may include low pass filters (LPF) 45-1 and 45-2 and gain blocks 46-1 and 46-2, respectively, although other BB circuits may be used. Mixer 40 generates an in-phase (I) signal, which is output to a BB processor 47. The mixer 41 generates a quadrature-phase (Q) signal, which is output to the BB processor 47.

Figure 2B:
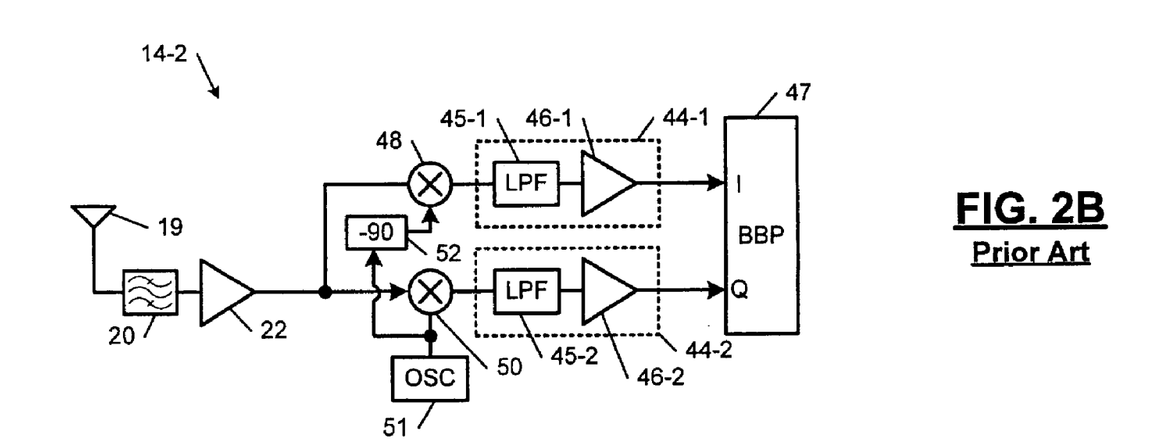
FIG. 2B is a functional block diagram of an exemplary direct receiver architecture according to the prior art.

Referring now to FIG. 2B, an exemplary direct conversion receiver 14-2 is shown. The receiver 14-2 includes the antenna 19 that is coupled the optional RF filter 20 and to the low noise amplifier 22. An output of the low noise amplifier 22 is coupled to first inputs of RF to BB mixers 48 and 50. A second input of the mixer 50 is connected to oscillator 51, which provides a reference frequency. A second input of the mixer 48 is connected to the oscillator 51 through a −90° phase shifter 52. The mixer 48 outputs the I-signal to the BB circuit 44-1, which may include the LPF 45-1 and the gain block 46-1. An output of the BB circuit 44-1 is input to the BB processor 47. Similarly, the mixer 50 outputs the Q signal to the BB circuit 44-2, which may include the LPF 45-2 and the gain block 46-2. An output of the BB circuit 44-2 is output to the BB processor 47.

Figure 3A:
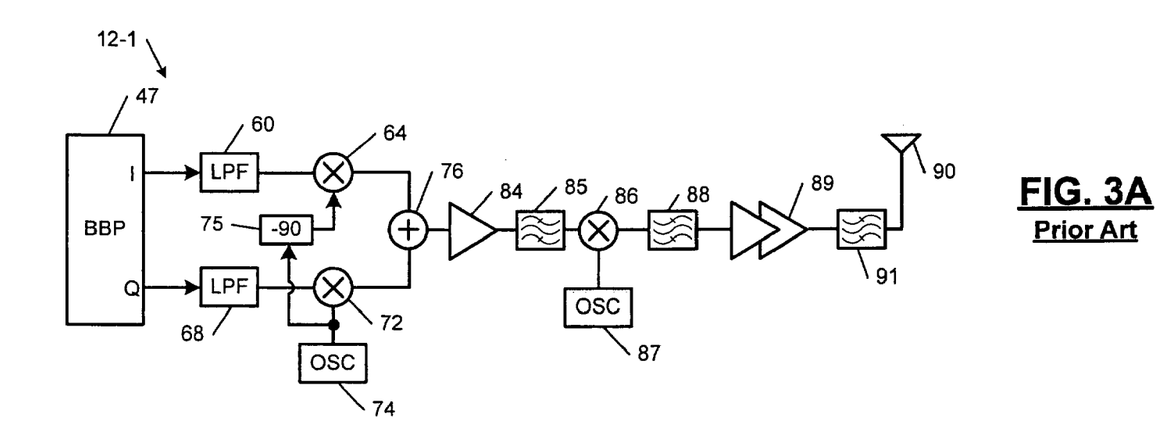
FIG. 3A is a functional block diagram of an exemplary super-heterodyne transmitter architecture according to the prior art.

Referring now to FIG. 3A, an exemplary super-heterodyne transmitter 12-1 is shown. The transmitter 12-1 receives an I signal from the BB processor 47. The I signal is input to a LPF 60 that is coupled to a first input of a BB to IF mixer 64. A Q signal of the BB processor 47 is input to a LPF 68 that is coupled to a first input of a BB to IF mixer 72. The mixer 72 has a second input that is coupled to an oscillator 74, which provides a reference frequency. The mixer 64 has a second input that is coupled to the oscillator through a −90° phase shifter 75.

Outputs of the mixers 64 and 72 are input to a summer 76. The summer 76 combines the signals into a complex signal that is input to a variable gain amplifier (VGA) 84. The VGA 84 is coupled to an optional IF filter 85. The optional IF filter 85 is connected to a first input of an IF to RF mixer 86. A second input of the mixer 86 is connected to an oscillator 87, which provides a reference frequency. An output of the mixer 86 is coupled to an optional RF filter 88. The optional RF filter 88 is connected to a power amplifier 89, which may include a driver. The power amplifier 89 drives an antenna 90 through an optional RF filter 91.

Figure 3B:
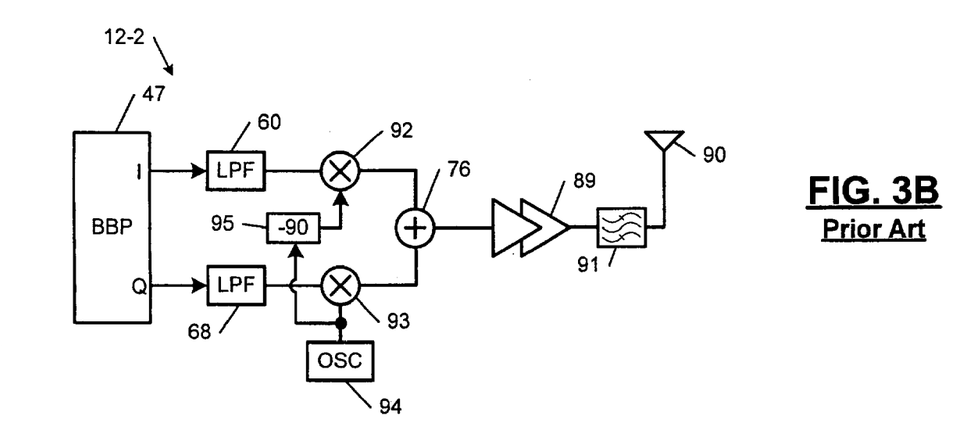
FIG. 3B is a functional block diagram of an exemplary direct transmitter architecture according to the prior art.

Referring now to FIG. 3B, an exemplary direct conversion transmitter 12-2 is shown. The transmitter 12-2 receives an I signal from the BB processor 47. The I signal is input to the LPF 60, which has an output that is coupled to a first input of a BB to RF mixer 92. A Q signal of the BB processor 47 is input to the LPF 68, which is coupled to a first input of a BB to RF mixer 93. The mixer 93 has a second input that is coupled to an oscillator 94, which provides a reference frequency. The mixer 92 has a second input that is connected to the oscillator 94 through a −90° phase shifter 95. Outputs of the mixers 92 and 93 are input to the summer 76. The summer 76 combines the signals into a complex signal that is input the power amplifier 89. The power amplifier 89 drives the antenna 90 through the optional RF filter 91. The RF and IF filters in FIGS. 2A, 2B, 3A and 3B may be implemented on-chip or externally.

Regardless of the architecture that is used, one of the primary functions performed by the transmitters and receivers is frequency conversion from BB to IF to RF and from RF to IF to BB. As described above, frequency conversion is performed in the mixers. Performance requirements of the mixers include conversion gain, noise and linearity.

In particular, mixer linearity is often a key parameter for systems with high performance requirements. In a receiver, mixer linearity affects the ability of the receiver to receive weak desired signals in the presence of strong adjacent-channel interference. In a transmitter, poor mixer linearity can cause excessive corruption in the transmitter spectrum and degrade signal integrity of the transmitter.

Figures 4A, 4B:
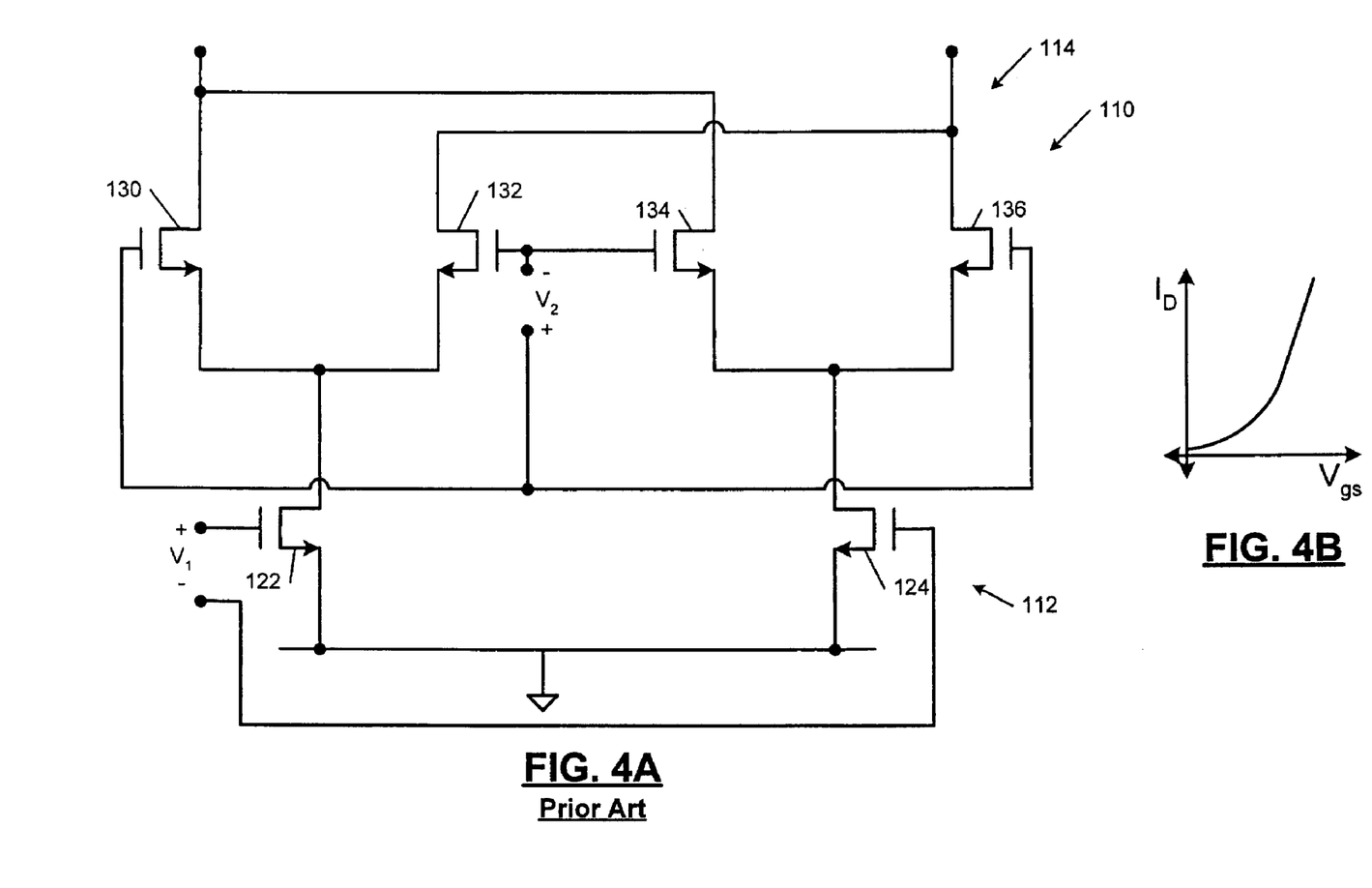
FIG. 4A is an electrical schematic of a Gilbert cell mixer implemented using CMOS transistors according to the prior art.
FIG. 4B illustrates $I_D$ as a function of $V_{GS}$ for a CMOS transistor.

The mixers in the WLAN transceiver 10 can be implemented using Gilbert cell mixers. Referring now to FIG. 4A, a Gilbert Cell mixer 110 that is implemented using CMOS transistors according to the prior art is shown. The Gilbert cell mixer 110 includes a first stage 112 that performs voltage to current conversion or transconductor stage and a second stage 114 that performs frequency conversion.

The Gilbert cell mixer 110 includes a transconductor stage that is formed by a first transistor 122 and a second transistor 124. The transistors 122 and 124 have a source that is connected to a reference potential such as ground. A gate of the first transistor 122 is connected to one lead of a first voltage source. A gate of the second transistor 124 is connected to another lead of the first voltage source. The Gilbert cell mixer 110 further includes third, fourth, fifth, and sixth transistors 130, 132, 134, and 136. A drain of the first transistor 122 is coupled to sources of the third and fourth transistors 130 and 132. A drain of the second transistor 124 is coupled to sources of the fifth and sixth transistors 134 and 136.

A gate of the fourth transistor 132 is connected to a gate of the fifth transistor 134. The gates of the fourth and fifth transistors 132 and 134 are connected to a first lead of a second voltage source. Another lead of the second voltage source is connected to gates of the third and sixth transistors 130 and 136. A drain of the third transistor 130 is connected to a drain of the fifth transistor 134. A drain of the fourth transistor 132 is connected to a drain of the sixth transistor 136. Typically, the first voltage source is a radio frequency, intermediate frequency, or baseband signal requiring frequency conversion (up or down) and the second voltage source is a local oscillator.

When implemented in the form of FIG. 4A, linearity of the Gilbert cell mixer is typically limited by the bottom transconductance stage. Moreover, depending on the biasing scheme, the linearity performance will vary over temperature and process corners.

SUMMARY OF THE INVENTION

A Gilbert cell mixer for a wireless transceiver includes a first stage that performs voltage to current conversion. The first stage includes first and second transistors that are operated in a saturation region and third and fourth transistors that are operated in a triode region. A second stage communicates with the first stage and performs frequency conversion. A biasing circuit communicates with the first stage and maintains a constant input linear range over temperature and process variations.

In other features, the transistors are implemented using complementary metal oxide semiconductor (CMOS) technology. The first stage further includes fifth and sixth transistors having sources connected to drains of the first and second transistors. Seventh and eighth transistors have sources connected to drains of the third and fourth transistors and drains connected to drains of the fifth and sixth transistors.

In yet other features, the biasing circuit includes a first voltage source that generates a first voltage that biases gates of the fifth and sixth transistors. A second voltage source generates a second voltage that biases gates of the seventh and eighth transistors. A third voltage source generates a third voltage that biases gates of the first, second, third and fourth transistors.

In other features, the second stage further includes ninth, tenth, eleventh, and twelfth transistors. Drains of the fifth and seventh transistors communicate with sources of the ninth and tenth transistors. The drains of the sixth and eighth transistors communicate with sources of the eleventh and twelfth transistors. The tenth and eleventh transistors have gates that communicate with a first lead of a second input voltage source. The ninth and twelfth transistors have gates that communicate with a second lead of the second input voltage source.

In still other features, the input linear range is proportional to $V_{Dsat}$ of the third and fourth transistors.

In other features, the biasing circuit includes a current source. A first resistance communicates with the current source. A second resistance communicates with the first resistance. A third resistance communicates with the second resistance. A transistor has a drain that communicates with the third resistance and a gate that communicates with the drain. The transistor has a low current density such that $V_{GS}$ of the transistor is approximately equal to $V_T$ of the transistor. A first voltage generated between the current source and the first resistor biases gates of the fifth and sixth transistors. A second voltage generated between the first and second resistors biases gates of the seventh and eighth transistors. A third voltage generated between the second and third resistors biases gates of the first, second, third and fourth transistors. The first, second and third resistances can be poly resistors.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses. For purposes of clarity, the same reference numbers will be used in the drawings to identify similar elements.

The biasing circuit for a Gilbert cell mixer according to the present invention enables the realization of linear transconductance over a constant linear input range using temperature sensitive transistor technologies such as CMOS technology. The present invention does not reduce mixer gain unlike conventional linearization schemes such as negative feedback. The present invention provides linearization without requiring high voltage headroom that is required by linearization using conventional emitter or source degeneration. The present invention establishes a linear relationship between transconductance and the bias current. As a result, a transconductance calibration methods can be used, for example see "Mixer Gain Calibration Method and Apparatus", Ser. No. 10/292,087, filed Nov. 11, 2002, which is hereby incorporated by reference in its entirety.

Figure 5:
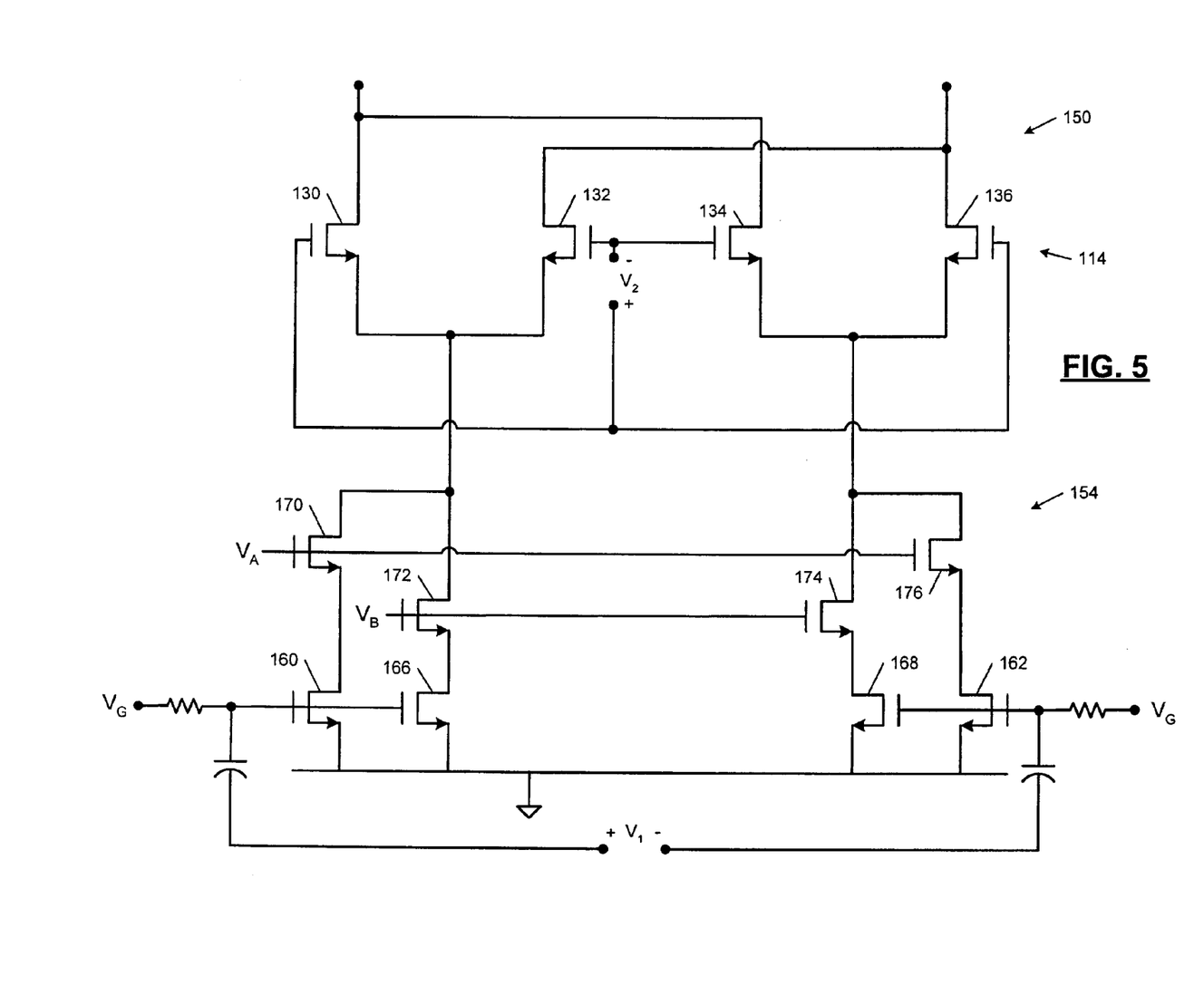
FIG. 5 illustrates a Gilbert cell mixer including a compensated input transconductor stage according to the present invention.

In the Gilbert-cell mixer 110 in FIG. 4A, the linearity of the mixer 110 is limited by the linearity of the first or input transconductor stage 112. Mixer linearity can be improved by linearizing the input transconductance stage 112. Referring now to FIG. 5, a Gilbert cell mixer 150 according to the present invention is shown and includes a compensated input transconductor stage 154. The compensated input transconductor stage 154 includes two transconductors that are connected in parallel. The first transconductor includes a first pair of transistors 160 and 162 that are biased into a saturation region. The second transconductor includes a second pair of transistors 166 and 168 that are biased into a triode region. The opposite gain characteristics of the first and second transconductors cancel each other and improve the overall linearity of the transconductor stage 154.

Sources of the transistors 160, 162, 166, and 168 are connected to a reference potential such as ground. The compensated input transconductor stage 154 further includes transistors 170, 172, 174, and 176. A source of the transistor 170 is connected to a drain of the transistor 160. A gate of the transistor 170 is connected to a gate of the transistor 176. A drain of the transistor 170 is connected to a drain of the transistor 172 and to sources of the transistors 130 and 132. A gate of the transistor 172 is connected to a gate of the transistor 174.

A drain of the transistor 176 is connected to a drain of the transistor 174 and to sources of the transistors 134 and 136. A source of the transistor 174 is connected to a drain of the transistor 168. A source of the transistor 176 is connected to a drain of the transistor 162. A gate of the transistor 162 is connected to a gate of the transistor 168. A gate of the transistor 160 is connected to a gate of the transistor 166. The transistors 170, 172, 174, and 176 preferably provide biasing for the transistors 160-168.

Linearity of the mixer 150 can be improved by using the compensated input transconductor stage 154. However, when the mixer 150 is implemented using CMOS technology, the input linear range of the mixer 150 can vary significantly with temperature and process variations.

Figure 6A:
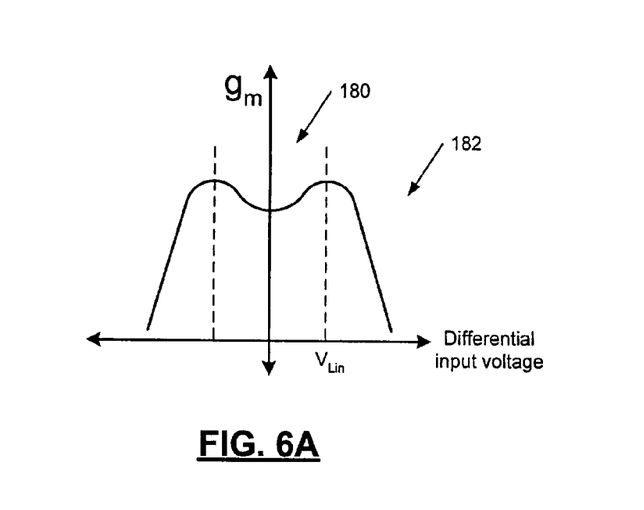
FIGS. 6A, 6B and 6C show transconductance ($g_m$) of transistor pairs as a function of differential input voltage for triode operation, saturated operation and combined operation, respectively.
Figure 6B:
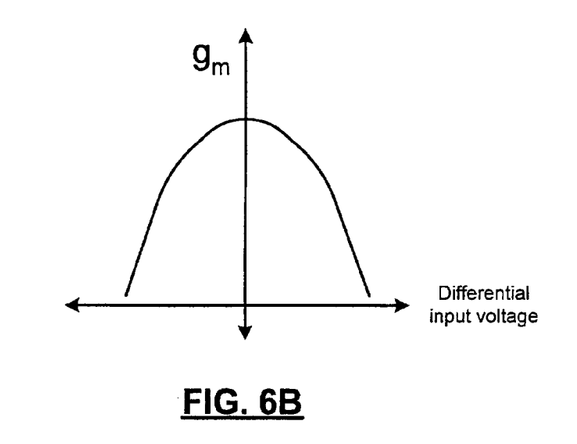
Figure 6C:
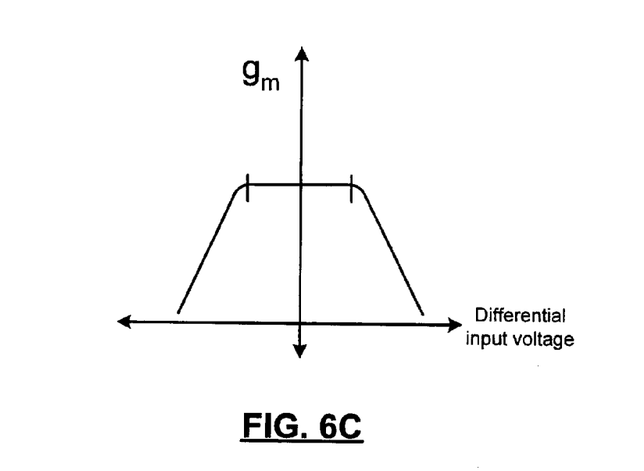

Referring now to FIGS. 6A, 6B and 6C, with proper biasing and device sizing, a gain characteristic of the saturation transistors 160 and 162 (shown in FIG. 6A) can be substantially cancelled by a gain characteristic of the triode transistors 166 and 168 (shown in FIG. 6B). The combined gain of the triode and saturation transistor pairs forms a substantially flat gain response that is shown in FIG. 6C. The flat gain response improves the linearity of the mixer 150.

The linear input range of the combined transconductance is mainly determined by the range of differential input signals for which the transconductance of the triode pair exhibits an expansive gain characteristic. The expansive gain characteristic region is shown generally at 180 in FIG. 6A and a compressive gain characteristic region is shown generally at 182 in FIG. 6A.

It is important for the triode pair to have a wide, expansive gain characteristic. Otherwise, the triode pair cannot be compensated by the compressive gain characteristic of the saturation pair to achieve the overall linearized transconductance. As the differential input signal increases beyond $V_{Lin}$ in FIG. 6A, the input transistor on one side of the triode pair ceases to be in the triode region and enters the saturation region. When this happens, the transconductance of the triode pair (one of which is in saturation) decreases as the absolute value of $V_{in}$ increases. In other words, the transconductance characteristics of the triode pair becomes compressive. The combined compensation with the saturation pair is no longer linearized.

Figure 7:
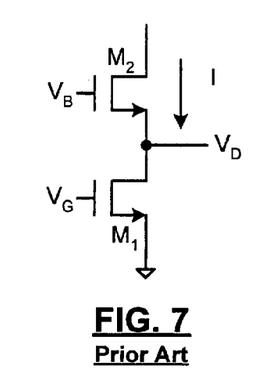
FIG. 7 illustrates a cascode configuration according to the prior art.

Referring now to FIG. 7, a simple cascode configuration is shown. The gate voltage of the bottom device is $V_G$. As long as the bottom device is in saturation ($V_G-V_T-V_D<0$), the transconductance increases with $V_G$.

$$I_D = \frac{K_1}{2}(V_G - V_T)^2;$$

$$K_1 = \mu C_{ox}\left(\frac{W}{L}\right); \text{ and}$$

therefore, $g_m = K_1(V_G - V_T)$;

then $g_m \uparrow$ as $V_G \uparrow$.

However, once $M_1$ enters the triode region ($V_G-V_T-V_D<0$), the transconductance decreases as a function of $V_G$.

$$I_D = K_1\left((V_G - V_T)V_D - \frac{V_D^2}{2}\right);$$

therefore, $$g_m = K_1\left[\left(V_D - (V_G - V_T - V_D)\frac{\partial V_D}{\partial V_G}\right)\right];$$

since $$(V_G - V_T - V_D) > 0 \text{ and} \frac{\partial V_D}{\partial V_G} < 0,$$

then $g_m \downarrow$ as $V_G \uparrow$.

The cross-over point happens when $V_D=V_G-V_T$. If $V_G'$ is the gate voltage at which the bottom device is on the verge of transitioning from triode to saturation region, then:

$$\frac{K_2}{2}(V_B - V_D - V_T)^2 = \frac{K_1}{2}(V'_G - V_T)^2;$$

Let $V_{G0}=V_G$ at an initial bias point and assume that $V_B$ is biased at a constant
voltage IR above $V_{G0}$ such that $V_B V_{G0}+IR$
also consider that $V_D=V_G'-V_T$;
Therefore, $$\sqrt{\frac{K_2}{K_1}}(V_{G0} + IR - V'_G) = V'_g - V_T;$$

If $V_{Lin}=V_{G0}-V_G=$ input linear range then $$\sqrt{\frac{K_2}{K_1}}(V_{Lin} + IR) = V_{G0} - V_{Lin} - V_T;$$

therefore $$V_{Lin} = \frac{V_{G0} - V_T}{1 + \sqrt{\frac{K_2}{K_1}}} - \frac{IR\sqrt{\frac{K_2}{K_1}}}{1 + \sqrt{\frac{K_2}{K_1}}}.$$

The first term on the right side of the "=" sign is proportional to $V_{Dsat}$ of M1 at the initial bias. If the bias current I is designed to compensate for the temperature coefficient of the resistor R (for example if the bias current is implemented in the form of a bandgap voltage over the same type of resistor), the second term on the right side of the "=" sign is a constant over temperature and process.

Therefore, $$V_{Lin}=a\times V_{Dsat}+\text{constant}$$

where "a" is a constant that depends on the relative sizing of the bottom cascode device. Therefore, the input linear range of the combined transconductance stage can be kept constant over temperature and process if the $V_{Dsat}$ of the input device is kept constant.

Figure 8:
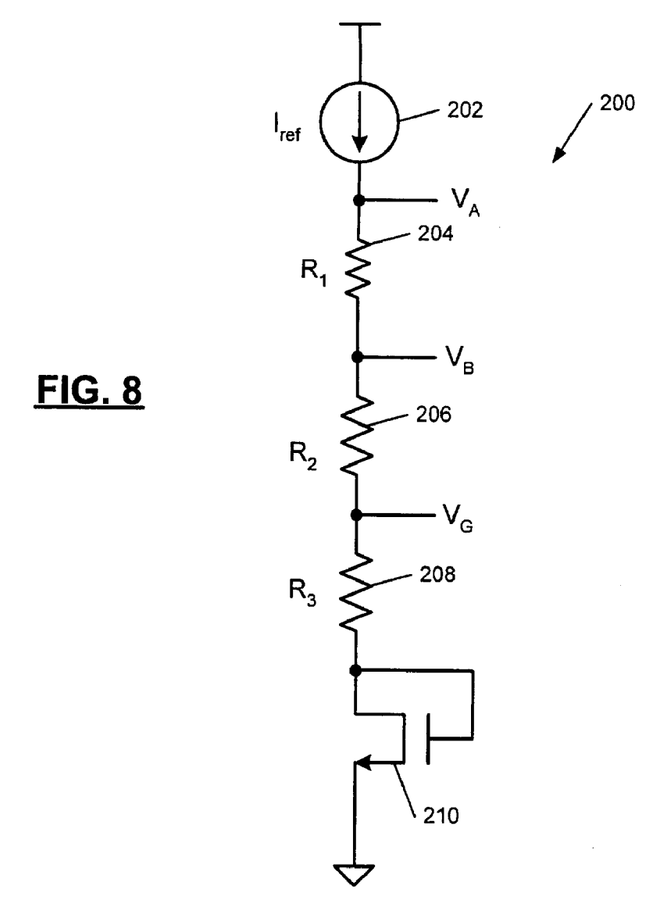
FIG. 8 is an electrical schematic of a constant $V_{Dsat}$ biasing circuit according to the present invention.

Referring now to FIG. 8, a constant $V_{Dsat}$ biasing circuit 200 according to the present invention maintains a substantially constant input linear range over temperature and process corners. The input linear range of the compensated transconductor stage 154 is strongly dependent on the $V_{Dsat}$ of the input devices. Without proper biasing, the input linear range can vary widely over temperature and process corners.

The constant $V_{Dsat}$ biasing circuit 200 includes a current source 202 that provides a current $I_{ref}$. A resistor 204 provides a resistance $R_1$. A resistor 206 provides a resistance $R_2$. A resistor 208 provides a resistance $R_3$. The resistors 204, 206, and 208 are connected in series to the current source 182. The resistors 204, 206 and 208 are preferably poly resistors, although the resistors 204, 206 and 208 can be discrete resistors, external resistors, or any other resistors. A transistor 210 has a drain that is connected to one end of the resistor 208. A gate of the transistor 210 is connected to the drain.

For the transistor 160 to operate in the saturation region, the following condition need to be met:

$$V_{DS\_160}>V_{GS\_160}-V_{T\_160}.$$

Therefore, $V_A-V_{GS\_170}>V_G-V_{T\_160}$;

$V_A-V_G>V_{GS\_170}-V_{T\_160}$; and $I_{ref}*(R_2+R_3)>V_{GS\_170}-V_{T\_160}.$ For the transistor 166 to operate in the triode region, the following condition need to be met:

$$V_{DS\_166}<V_{GS\_166}-V_{T\_166}.$$

Therefore, $V_B-V_{GS\_172}<V_G-V_{T\_166}$; and $V_B-V_G=I_{ref}*R_2<V_{GS\_172}-V_{T\_166}.$ The transistor 210 is biased at low current density such that $V_{GS} \sim V_T$ and $V_G=V_{GS\_210}+I_{ref}*R_1 \approx V_T+I_{ref}*R_1$. $V_{Dsat}$ of transistors 160, 162, 166, and 168 is equal to $V_G-V_T \approx I_{ref}*R_1$, when $I_{ref}$ is generated by a bandgap voltage over the same type of resistors $R_1$, $R_2$ and $R_3$. Therefore, $I_{ref}*R_1$ (and therefore $V_{Dsat}$ of transistors 160, 162, 166, and 168) is constant over process corners and temperature. Decoupling capacitors to ground can be optionally added to node $V_A$, $V_B$, and $V_G$ to stabilize the bias voltages.

The transistor 210 preferably has a channel length that is approximately the same as the transistor 160. Therefore, the transistor 210 has approximately the same threshold voltage ($V_T$) as the transistor 160. $V_{Dsat\_210}$ is approximately equal to $V_{GS\_210}-V_T=I_{ref}*R+V_{GS\_160}-V_T=I_{ref}*R$. As a result, $I_{ref}*R$ is independent of temperature and process variation.

In other words, the biasing circuit 200 provides a bias that is equal to ($V_T+V_{constant}$). The $V_T$ term in the voltage bias is equal to the $V_T$ of the transistors 160, 166 and 162, 168 and is cancelled to provide the constant bias voltage $V_{constant}$.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A Gilbert cell mixer for a wireless transceiver, comprising:
a first stage that performs voltage to current conversion and that includes first and second transistors that are operated in a saturation region and third and fourth transistors that are operated in a triode region;
a second stage that communicates with said first stage and that performs frequency conversion; and
a biasing circuit that communicates with said first stage and that maintains a constant input linear range over temperature and process variations,
wherein said first stage further includes fifth and sixth transistors having sources that communicate with drains of said first and second transistors and seventh and eighth transistors having sources that communicate with drains of said third and fourth transistors and drains that communicate with drains of said fifth and sixth transistors, and
wherein said biasing circuit includes:
a first voltage source that generates a first voltage that biases gates of said fifth and sixth transistors;

a second voltage source that generates a second voltage that biases gates of said seventh and eighth transistors; and a third voltage source that generates a third voltage that biases gates of said first, second, third and fourth transistors.

2. The Gilbert cell mixer of claim 1 wherein said transistors are implemented using complementary metal oxide semiconductor (CMOS) technology.

3. The Gilbert cell mixer of claim 1 wherein a first input voltage source that is input to said first stage is one of a baseband signal, an intermediate frequency signal and a radio frequency signal.

4. The Gilbert cell mixer of claim 1 wherein said second stage further includes:

ninth, tenth, eleventh, and twelfth transistors, wherein said drains of said fifth and seventh transistors communicate with sources of said ninth and tenth transistors, and wherein said drains of said sixth and eighth transistors communicate with sources of said eleventh and twelfth transistors, and wherein said tenth and eleventh transistors have gates that communicate with a first lead of a second input voltage source and said ninth and twelfth transistors have gates that communicate with a second lead of said second input voltage source.

5. The Gilbert cell mixer of claim 4 wherein said second voltage source is a local oscillator.

6. The Gilbert cell mixer of claim 1 wherein said input linear range is proportional to $V_{Dsat}$ Of said third and fourth transistors.

7. The Gilbert cell mixer of claim 1 wherein said biasing circuit includes:

a current source;

a first resistance that communicates with said current source;

a second resistance that communicates with said first resistance;

a third resistance that communicates with said second resistance; and a transistor that has a drain that communicates with said third resistance and a gate that communicates with said drain, wherein said transistor has a low current density such that $V_{GS}$ of said transistor is approximately equal to $V_T$ of said transistor.

8. A Gilbert cell mixer for a wireless transceiver, comprising:

a first stage that performs voltage to current conversion and that includes first and second transistors that are operated in a saturation region and third and fourth transistors that are operated in a triode region;

a second stage that communicates with said first stage and that performs frequency conversion; and a biasing circuit that communicates with said first stage, that maintains a constant input linear range over temperature and process variations, and that comprises:

a current source;

a first resistance that communicates with said current source;

a second resistance that communicates with said first resistance;

a third resistance that communicates with said second resistance; and a transistor that has a drain that communicates with said third resistance and a gate that communicates with said drain, wherein said transistor has a low current density such that $V_{GS}$ of said transistor is approximately equal to $V_T$ of said transistor, wherein said first stage further includes fifth and sixth transistors having sources that communicate with drains of said first and second transistors and seventh and eighth transistors having sources that communicate with drains of said third and fourth transistors and drains that communicate with drains of said fifth and sixth transistors, and wherein a first voltage generated between said current source and said first resistance biases gates of said fifth and sixth transistors, wherein a second voltage generated between said first and second resistances biases gates of said seventh and eighth transistors, and wherein a third voltage generated between said second and third resistances biases gates of said first, second, third and fourth transistors.

9. The Gilbert cell mixer of claim 8 wherein said first, second and third resistances are provided by poly resistors.

10. The Gilbert cell mixer of claim 8 wherein said transistors are implemented using complementary metal oxide semiconductor (CMOS) technology.

11. The Gilbert cell mixer of claim 8 wherein a first input voltage source that is input to said first stage is one of a baseband signal, an intermediate frequency signal and a radio frequency signal.

12. The Gilbert cell mixer of claim 8 wherein said second stage further includes:

ninth, tenth, eleventh, and twelfth transistors, wherein said drains of said fifth and seventh transistors communicate with sources of said ninth and tenth transistors, and wherein said drains of said sixth and eighth transistors communicate with sources of said eleventh and twelfth transistors, and wherein said tenth and eleventh transistors have gates that communicate with a first lead of a second input voltage source and said ninth and twelfth transistors have gates that communicate with a second lead of said second input voltage source.

13. The Gilbert cell mixer of claim 12 wherein said second voltage source is a local oscillator.

14. The Gilbert cell mixer of claim 8 wherein said input linear range is proportional to $V_{Dsat}$ of said third and fourth transistors.

15. A transceiver including a Gilbert cell mixer, comprising:

at least one of a transmitter and a receiver, wherein said at least one of said transmitter and said receiver includes a Gilbert cell mixer that includes:

a first stage that performs voltage to current conversion and that comprises:

first and second transistors that are operated in a saturation region;

third and fourth transistors that are operated in a triode region;

fifth and sixth having sources that communicate with drains of said first and second transistors; and seventh and eighth transistors having sources that communicate with drains of said third and fourth transistors and drains that communicate with drains of said fifth and sixth transistors;

a second stage that communicates with said first stage and that performs frequency conversion; and a biasing circuit that communicates with said first stage and that provides a constant input linear range over temperature and process variations wherein said constant input linear range is proportional to $V_{Dsat}$ of said third and fourth transistors, said biasing circuit comprises:
  a first voltage source that generates a first voltage that biases gates of said fifth and sixth transistors;
  a second voltage source that generates a second voltage that biases gates of said seventh and eighth transistors; and
  a third voltage that biases gates of said first, second, third and fourth transistors.

16. The transceiver of claim 15 wherein said transistors are implemented using complementary metal oxide semiconductor (CMOS) technology.

17. The transceiver of claim 15 wherein a first input voltage source that is input to said first stage is one of a baseband signal, an intermediate frequency signal and a radio frequency signal.

18. The transceiver of claim 15 wherein said second stage further includes:
  ninth, tenth, eleventh, and twelfth transistors,
  wherein said drains of said fifth and seventh transistors communicate with sources of said ninth and tenth transistors, and wherein said drains of said sixth and eighth transistors communicate with sources of said eleventh and twelfth transistors, and
  wherein said tenth and eleventh transistors have gates that communicate with a first lead of a second input voltage source and said ninth and twelfth transistors have gates that communicate with a second lead of said second input voltage source.

19. The transceiver of claim 18 wherein said second voltage source is a local oscillator.

20. The transceiver of claim 15 wherein said biasing circuit includes:
  a current source;
  a first resistance that communicates with said current source;
  a second resistance that communicates with said first resistance;
  a third resistance that communicates with said second resistance; and
  a transistor that has a drain that communicates with said third resistance and a gate that communicates with said drain, wherein said transistor has a low current density such that $V_{GS}$ is approximately equal to $V_T$ of said transistor.

21. The transceiver of claim 20 wherein said first, second and third resistances are provided by poly resistors.

22. A transceiver including a Gilbert cell mixer, comprising:
  at least one of a transmitter and a receiver
  wherein said at least one of said transmitter and said receiver includes a Gilbert cell mixer that includes:
    a first stage that performs voltage to current conversion and that comprises;
      first and second transistors that are operated in a saturation region
      third and fourth transistors that are operated in a triode region;
      fifth and sixth transistors having sources that communicate with drains of said first and second transistors; and
      seventh and eighth transistors having sources that communicate with drains of said third and fourth transistors and drains that communicate with drains of said fifth and sixth transistors;
    a second stage that communicates with said first stage and that performs frequency conversion; and
    a biasing circuit that communicates with said first stage and that provides a constant input linear range over temperature and process variations wherein said constant input linear range is proportional to $V_{Dsat}$ of said third and fourth transistors, said biasing circuit comprising:
      a current source;
      a first resistance that communicates with said current source;
      a second resistance that communicates with said first resistance;
      a third resistance that communicates with said second resistance; and
      a transistor that has a drain that communicates with said third resistance and a gate that communicates with said drain, wherein said transistor has a low current density such that $V_{GS}$ is approximately equal to $V_T$ of said transistor,
    wherein a first voltage is generated between said current source and said first resistance biases gates of said fifth and sixth transistors, wherein a second voltage generated between said first and second resistances biases gates of said seventh and eighth transistors, and wherein a third voltage generated between said second and third resistances biases gates of said first, second, third and fourth transistors.

23. The transceiver of claim 22 wherein said first, second and third resistances are provided by poly resistors.

24. A Gilbert cell mixer, comprising:
  a first stage that performs voltage to current conversion, that provides a first gain, and that comprises;
    first and second CMOS transistors that are operated in a saturation region;
    third and fourth CMOS transistors that are operated in a triode region;
    fifth and sixth transistors having sources that communicate with drains of said first and second transistors; and
    seventh and eighth transistors having sources that communicate with drains of said third and fourth transistors and drains that communicate with drains of said fifth and sixth transistors:
  a second stage that communicates with said first stage and that performs frequency conversion; and
  a biasing circuit that communicates with said first stage, wherein said Gilbert cell mixer is implemented using CMOS transistors, and wherein said biasing circuit linearizes said first gain over an input voltage range and over temperature and process variations without reducing said first gain, said biasing circuit comprising:
    a first voltage source that generates a first voltage that biases gates of said fifth and sixth transistors;
    a second voltage source that generates a second voltage that biases gates of said seventh and eighth transistors; and
    a third voltage source that generates a third voltage that biases gates of first, second, third and fourth transistors.

25. The Gilbert cell mixer of claim 24 wherein said input voltage range is proportional to $V_{Dsat}$ of said third and fourth CMOS transistors.

26. The Gilbert cell mixer of claim 24 wherein a first input voltage source that is input to said first stage is one of a baseband signal, an intermediate frequency signal and a radio frequency signal.

27. The Gilbert cell mixer of claim 24 wherein said second stage further includes:

ninth, tenth, eleventh, and twelfth transistors, wherein said drains of said fifth and seventh transistors communicate with sources of said ninth and tenth transistors, and wherein said drains of said sixth and eighth transistors communicate with sources of said eleventh and twelfth transistors, and wherein said tenth and eleventh transistors have gates that communicate with a first lead of a second input voltage source and said ninth and twelfth transistors have gates that communicate with a second lead of said second input voltage source.

28. The Gilbert cell mixer of claim 24 wherein said biasing circuit includes:

a current source;

a first resistance that communicates with said current source;

a second resistance that communicates with said first resistance;

a third resistance that communicates with said second resistance; and a transistor that has a drain that communicates with said third resistance and a gate that communicates with said drain, wherein said transistor has a low current density such that $V_{GS}$ is approximately equal to $V_T$ of said transistor.

29. The Gilbert cell mixer of claim 28 wherein said first, second and third resistances are provided by poly resistors.

30. A Gilbert cell mixer, comprising:

a first stage that Performs voltage to current conversion, provides a first gain, and that comprises;

first and second CMOS transistors that are operated in a saturation region;

third and fourth CMOS transistors that are operated in a triode region;

fifth and sixth transistors having sources that communicate with drains of said first and second transistors; and seventh and eighth transistors having sources that communicate with drains of said third and fourth transistors and drains that communicate with drains of said fifth and sixth transistors;

a second stage that communicates with said first stage and that performs frequency conversion; and a biasing circuit that communicates with said first stage, wherein said Gilbert cell mixer is implemented using CMOS transistors, and wherein said biasing circuit linearizes said first gain over an input voltage range and over temperature and process variations without reducing said first gain, said biasing circuit comprising;

a current source;

a first resistance that communicates with said current source;

a second resistance that communicates with said first resistance;

a third resistance that communicates with said second resistance; and a transistor that has a drain that communicates with said third resistance and a gate that communicates with said drain, wherein said transistor has a low current density such that $V_{GS}$ is approximately equal to $V_T$ of said transistor, wherein a first voltage is generated between said current source and said first resistance biases gates of said fifth and sixth transistors, wherein a second voltage generated between said first and second resistances biases gates of said seventh and eighth transistors, and wherein a third voltage generated between said second and third resistances biases gates of first, second, third and fourth transistors.

31. The Gilbert cell mixer of claim 30 wherein said first, second and third resistances are provided by poly resistors.

32. The Gilbert cell mixer of claim 30 wherein said input voltage range is proportional to $V_{Dsat}$ of said third and fourth CMOS transistors.

33. The Gilbert cell mixer of claim 30 wherein a first input voltage source that is input to said first stage is one of a baseband signal, an intermediate frequency signal and a radio frequency signal.

34. The Gilbert cell mixer of claim 30 wherein said second stage further includes:

ninth, tenth, eleventh, and twelfth transistors, wherein said drains of said fifth and seventh transistors communicate with sources of said ninth and tenth transistors, and wherein said drains of said sixth and eighth transistors communicate with sources of said eleventh and twelfth transistors, and wherein said tenth and eleventh transistors have gates that communicate with a first lead of a second input voltage source and said ninth and twelfth transistors have gates that communicate with a second lead of said second input voltage source.

* * * * *